(12) United States Patent
Lee et al.

(10) Patent No.: US 6,703,677 B2
(45) Date of Patent: Mar. 9, 2004

(54) SUBMOUNT INTEGRATED PHOTODIODE AND LASER DIODE PACKAGE USING THE SAME

(75) Inventors: Kyung Ho Lee, Seoul (KR); Jeong Ho Yoon, Seoul (KR); Bang Won Oh, Kyungki-do (KR); Si Young Yang, Kyungki-do (KR); Jong Hwa Lee, Kyungki-do (KR)

(73) Assignee: Samsung Electro-Mechanics Co., Ltd., Kyungki-do (KR)

( * ) Notice: Subject to any disclaimer, the term of this patent is extended or adjusted under 35 U.S.C. 154(b) by 0 days.

(21) Appl. No.: 10/231,029

(22) Filed: Aug. 30, 2002

(65) Prior Publication Data

US 2003/0232485 A1 Dec. 18, 2003

(30) Foreign Application Priority Data

Jun. 18, 2002 (KR) .......................... 2002-33900

(51) Int. Cl.[7] .................. H01L 27/14; H01L 31/00
(52) U.S. Cl. .................. 257/431; 257/459; 257/918
(58) Field of Search .................. 257/431, 437, 257/440, 448, 459, 467, 713, 729, 918

(56) References Cited

U.S. PATENT DOCUMENTS 5,557,116 A * 9/1996 Masui et al.

* cited by examiner

*Primary Examiner*—Phuc T. Dang
(74) *Attorney, Agent, or Firm*—Lowe Hauptman Gilman & Berner LLP

(57) ABSTRACT

Disclosed is a submount integrated photodiode package with an improved metal layer configuration and laser diode package using the same. In particular, a unitary laser diode of the invention provides a light receiving area overlying a semiconductor substrate to correspond to a radiation area of light emitted from a laser diode so as to reduce chip size in respect to a conventional one while maintaining a monitoring current identical to the conventional one as well as improve heat-radiating features. The invention provides a unitary laser diode package which comprises a light receiving area overlying a semiconductor substrate and having the same configuration as a radiation area of emission light from the laser diode and a metal layer adjacent to the light receiving area.

10 Claims, 12 Drawing Sheets

(1 of 12 Drawing Sheet(s) Filed in Color)

SUBMOUNT INTEGRATED PHOTODIODE AND LASER DIODE PACKAGE USING THE SAME

BACKGROUND OF THE INVENTION

1. Field of the Invention

The present invention relates to a unitary laser diode with an improved metal layer configuration, and more particularly, a submount integrated photodiode and laser diode package using the same which provides a light receiving area corresponding to a radiation area of light emitted from a laser diode, electrodes adjacent to the light receiving area and a metal layer functioning to radiate heat so as to reduce chip size in respect to a conventional one while maintaining a monitoring current identical with the conventional one as well as improve heat-radiating features.

2. Description of the Related Art

As well known in the art, a laser diode package emitting light via a laser diode is used in an optical pickup system, in which a photodiode used in the laser diode package detects the reflected quantity of emission light to adjust the output power of the laser diode. That is, the laser diode radiates backward about 10 to 30% of the total quantity of light emitted from a laser, and the photodiode detects and converts an optical signal radiated like this into a monitoring current Im. At this time, the laser diode can be sensed to continuously output a constant rated power through the monitoring current from the photodiode.

The laser diode generates heat while it emits light, in which the output power of the laser diode is lowered as the temperature is raised. As the power of the laser diode is lowered owing to high temperature, it is needed to apply higher input power to the laser diode in order to maintain the same output power. This consequently generates more heat thereby functioning as the most prominent reason which degrades the reliability of the laser diode or causes defects to the same. Therefore, it is important to consider heat-radiation in designing the laser diode.

In general, the photodiode in use for the laser diode is divided into a separate photodiode 110 as shown in FIG. 1A and a unitary photodiode 120 as shown in FIG. 1B. The separate photodiode is separated from a submount for mounting the laser diode, and is discriminated from the unitary photodiode in which the photodiode is integrally mounted to the submount and the laser mount is mounted on the photodiode. Using the unitary photodiode can advantageously reduce material cost and simplify assembly process, but disadvantageously deteriorate heat-radiating features thereby raising the temperature of the laser diode on the other hand. However, application of the unitary photodiode tends to gradually increase since it can reduce the cost of manufacture as well as advantageously implement downsizing. This accordingly increases the necessity for the optimized heat-radiating design.

FIG. 2 illustrates a conventional heat-radiating design of the unitary photodiode as set forth above.

As shown in FIG. 2, an Al layer (or metal layer) 230 is formed underlying a laser diode 210, and a light receiving area 220 is formed adjacent to the Al layer 230. The light receiving area is simply designed as a square without consideration of radiation features of the laser diode. Such a heat radiating structure, however, is designed without consideration of an unnecessary portion in the light receiving area which does not affect to the monitoring current Im.

It is therefore required to provide a laser diode package in which a light receiving area is formed based upon the heat-radiating features of the laser diode and a metal layer is accordingly designed so as to obtain the optimum heat-radiating performance.

SUMMARY OF THE INVENTION

The present invention has been made to solve the above problems and it is an object of the present invention to provide a laser diode package in which the configuration of a light receiving area and metal layer is optimally designed in an upper plane of a photodiode based upon a radiation area of a laser so as to reduce the size and improve heat-radiating features over a conventional art design while ensuring a monitoring current identical with that of the conventional one.

According to an aspect of the invention to obtain the above objects, the invention provides a submount integrated photodiode mounted with a laser diode and laser diode package using the same which comprises: a semiconductor substrate having lower electrodes at the bottom; a light receiving area provided in an upper plane of the semiconductor substrate, and configured identical with an area in the upper plane of the semiconductor substrate made by light emitted from the laser diode to receive the light emitted from the laser diode; a metal layer provided adjacent to the light receiving area to cover the upper plane except for the light receiving area; and a bonding layer positioned overlying the metal layer on the semiconductor substrate for mounting the laser diode.

In the submount integrated photodiode and laser diode package using the same of the invention, the light receiving area preferably has a substantially triangular configuration widening as extending from a position adjacent to the laser diode toward the end of the semiconductor substrate.

BRIEF DESCRIPTION OF THE DRAWINGS

The patent application contains one drawings executed in color. Copies of this patent application publication with color drawings will be provided by the Patent Office upon request and payment of the necessary fee.

The above and other objects, features and other advantages of the present invention will be more clearly understood from the following detailed description taken in conjunction with the accompanying drawings, in which:

FIGS. 7A and 7B show graphs each obtained by measuring radiation angles of emission light from a laser diode according to angular directions, in which FIG. 7A shows values in the horizontal direction, and FIG. 7B shows values in the vertical direction;

FIGS. 9A and 9B are graphs for showing correspondence between experiment values and simulation values in a laser diode package of the invention, in which FIG. 9A shows an example which has no heat sink, and FIG. 9B shows another example which has heat sink.

DETAILED DESCRIPTION OF THE PREFERRED EMBODIMENT

Hereinafter the present invention will be described in detail in reference to the accompanying drawings.

Figure 3:
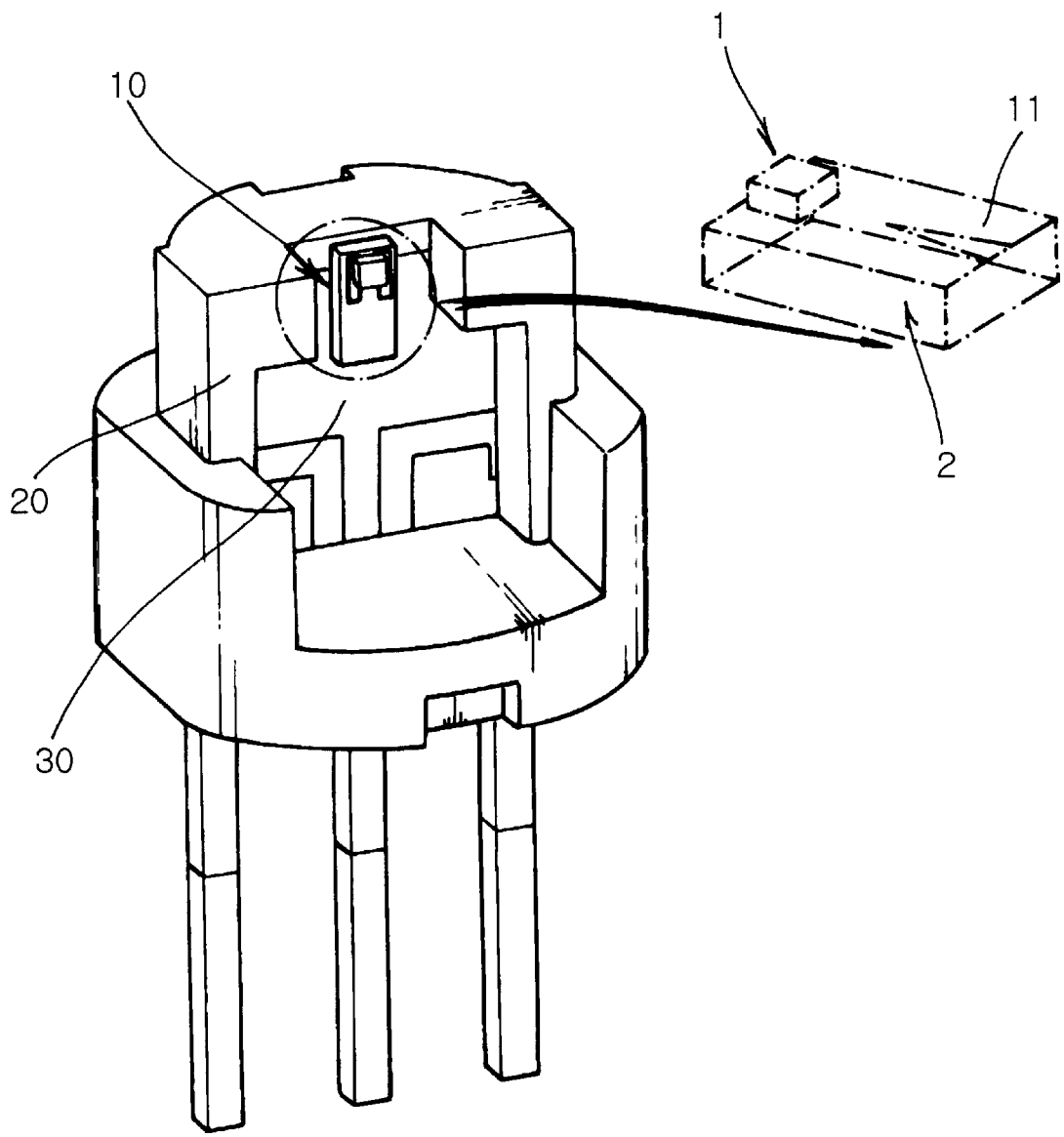
FIG. 3 is a perspective view of a laser diode package including a photodiode of the invention.

FIG. 3 is a perspective view of a laser diode package including a submount integrated photodiode of the invention, which is coupled with a lead frame.

Figure 1A:
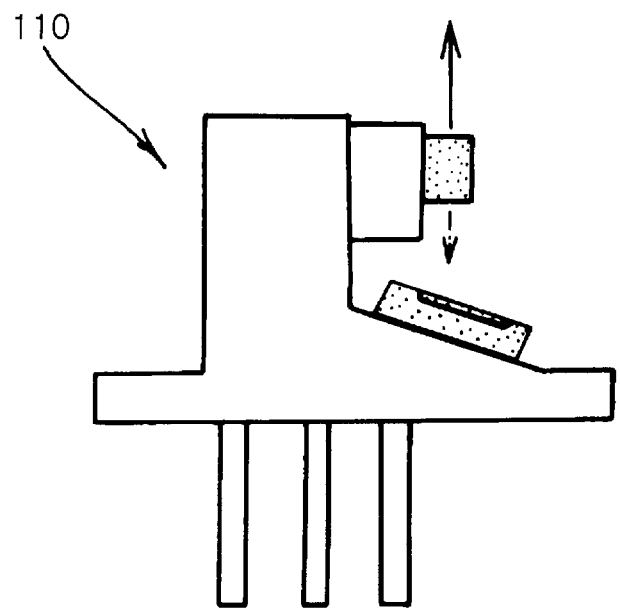
FIG. 1A is a sectional view of a laser diode package using a conventional separate photodiode.
Figure 1B:
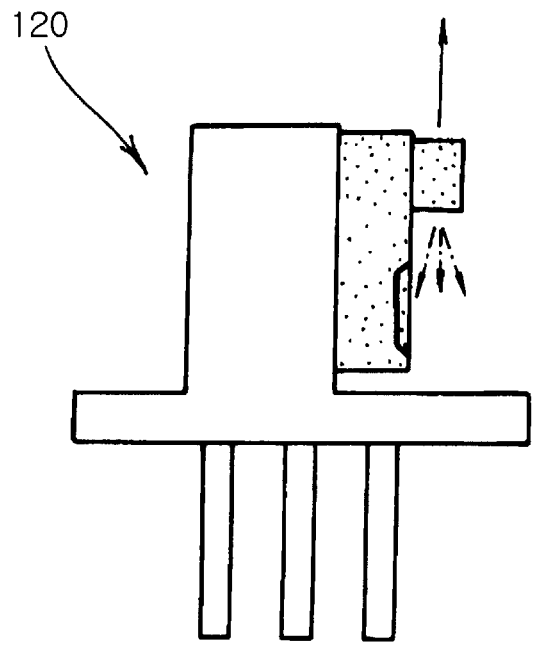
FIG. 1B is a sectional view of a laser diode package using a conventional unitary photodiode.
Figure 2:
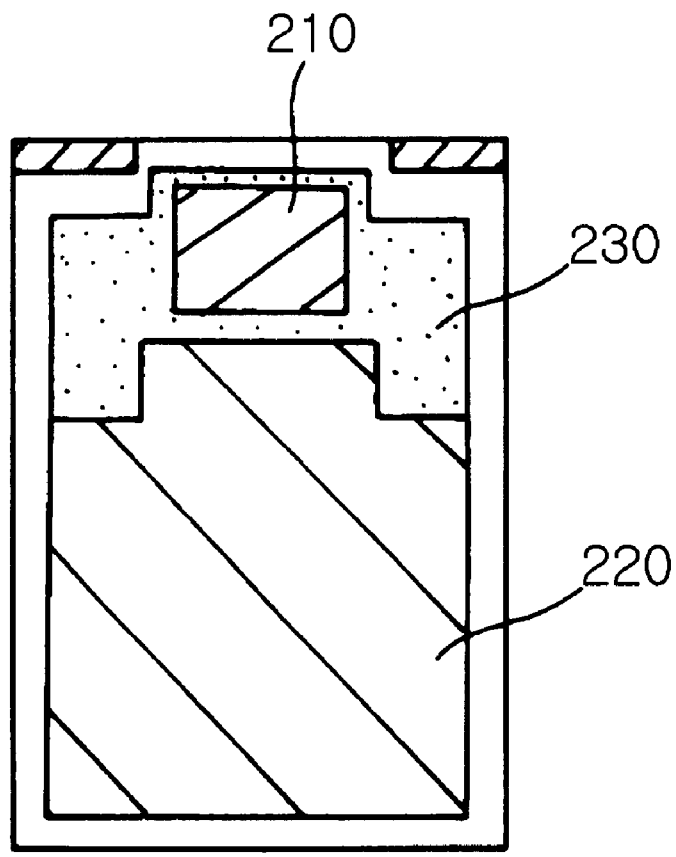
FIG. 2 is a plan view of a light receiving area in a conventional unitary photodiode.

As shown in FIG. 3, a light receiving area and a metal layer 11 of an inventive configuration are formed on a unitary photodiode 2, and a laser diode 1 is mounted to the photodiode 2 in one side of the upper plane thereof. The laser diode package 10 is mounted to a housing 20 having lead frames 30 as shown in FIG. 1. An anti-reflection layer (not shown) for preventing reflection of emission light from the laser diode may be preferably provided overlying the light receiving area via vapor deposition.

Figure 4:
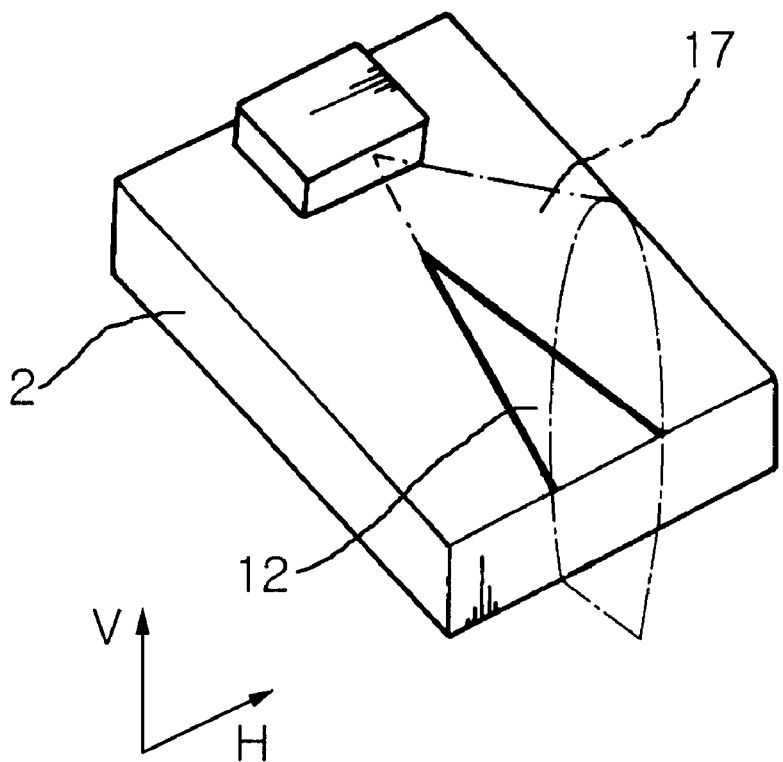
FIG. 4 is a perspective view showing emission light from a laser diode being floodlit to a light receiving area in a photodiode.

FIG. 4 is a perspective view showing emission light from the laser diode 1 being floodlit to the light receiving area 12 of the photodiode 2. Light 17 radiated backward to the photodiode 2 for the purpose uniformly maintaining the output power of the laser diode 1 has a radiation configuration as shown in FIG. 4. The emission light 17 has radiation angles in vertical and horizontal directions V and H as shown as in graphs of FIGS. 7A and 7B.

Figure 7A:
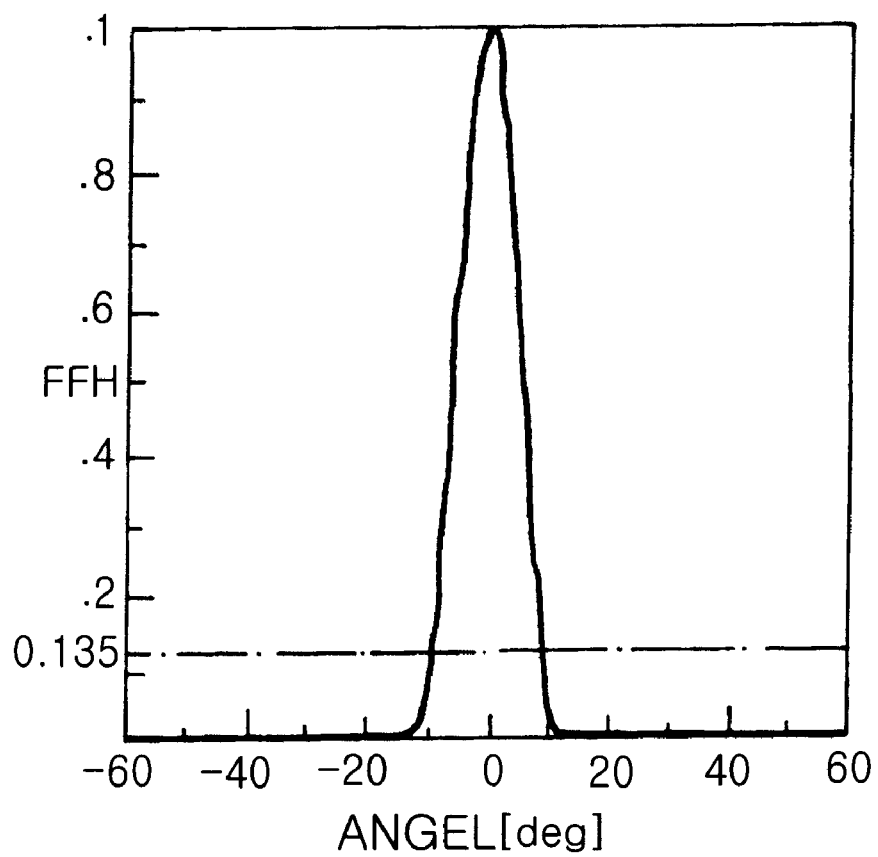
Figure 7B:
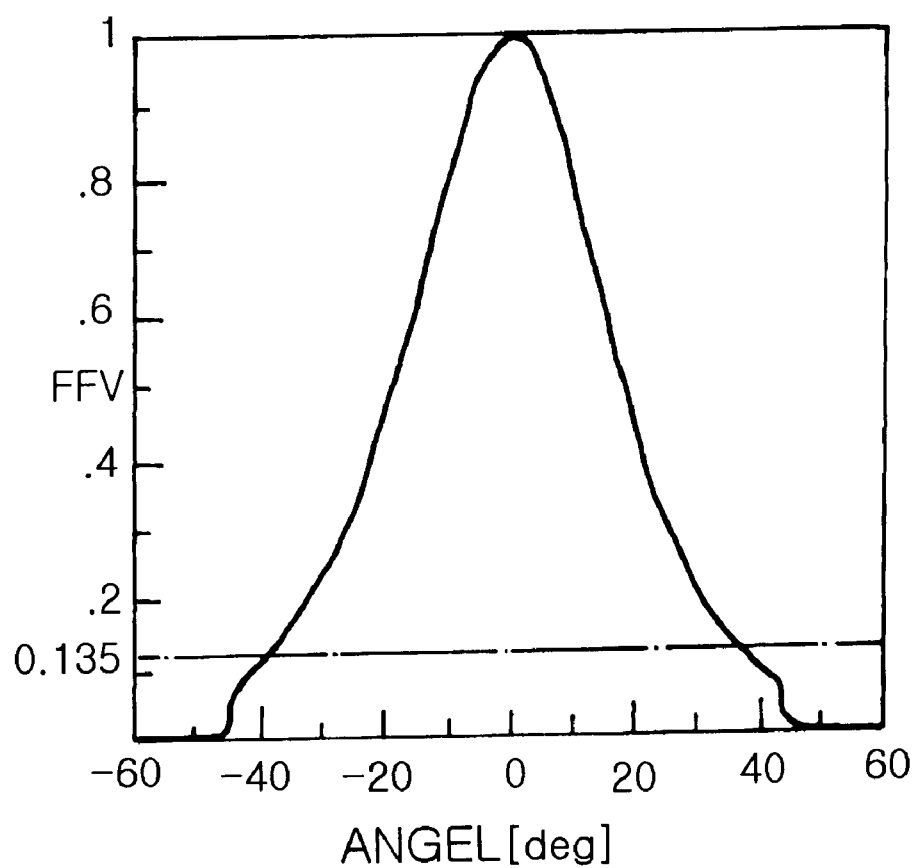

FIGS. 7A and 7B show graphs each obtained by measuring radiation angles of the emission light from the laser diode according to angular directions, in which. FIG. 7A shows values in the horizontal direction, and FIG. 7B shows values in the vertical direction. In FIGS. 7A and 7B, the radiation angles are defined to have a value of $1/e^2$ (0.135) as far field patterns FFH and FFV of the angular directions. Therefore, where the longitudinal value is 0.135 as in FIGS. 7A and 7B, the angular displacement has a value of about 18 deg. in the horizontal direction and about 73.3 deg. in the vertical direction.

Based upon the measured values as above, FIG. 4 shows an area on which the emission light 17 is projected in the light receiving area 12, in which the projection area functions as a sensor section for adjusting the output power of the laser diode 1.

Figure 5:
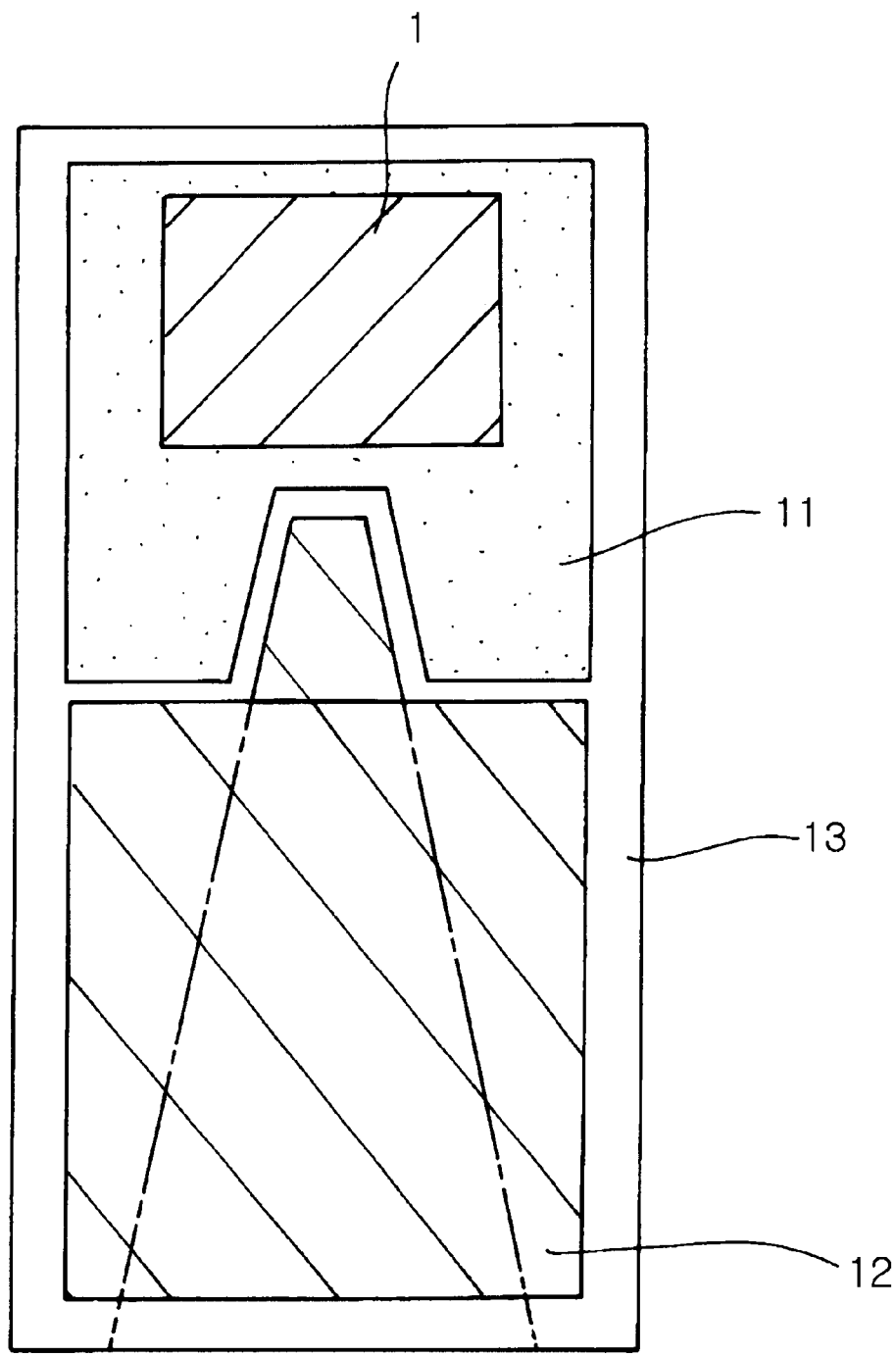
FIG. 5 is a plan view of a laser diode package according to heat-radiating design of the invention.

FIG. 5 is a plan view of the photodiode designed for heat radiation according to the invention. With the invention, the light receiving area 12 is so provided to correspond to the projection area as shown in FIG. 4, and the metal layer 11 is formed around the projection area so as to effectively radiate heat generated therefrom. The metal layer 11 is preferably made of Al.

As shown in FIG. 5, the metal layer 11 of the invention is provided adjacent to the light receiving area 12 overlying an N-type semiconductor substrate 13. The light receiving area 12 is substantially triangular-shaped with its width increasing as extending from a region adjacent to the laser diode 1 toward the tip of the semiconductor substrate 13 opposite to the laser diode 1. Therefore, the metal layer 11 covers the remaining portion of the semiconductor substrate 13 other than the light receiving area 12 so as to radiate the heat generated from the laser diode 1.

Figure 6A:
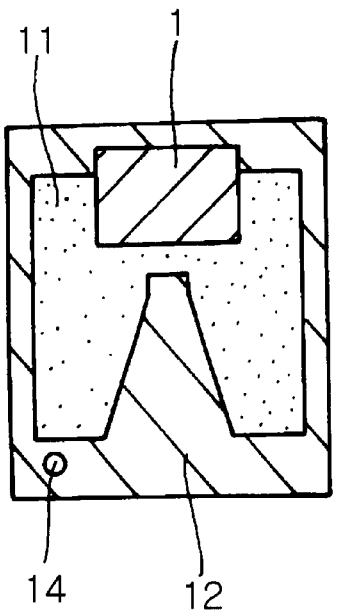
FIGS. 6A to 6C each show a metal layer and light receiving area in a laser diode package according to several alternative embodiments of the invention.
Figure 6B:
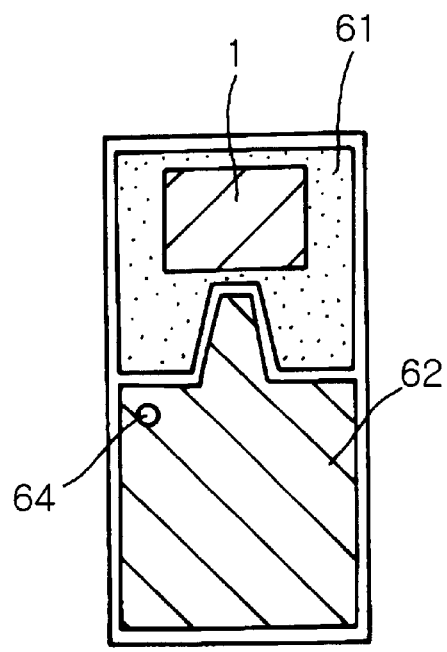
Figure 6C:
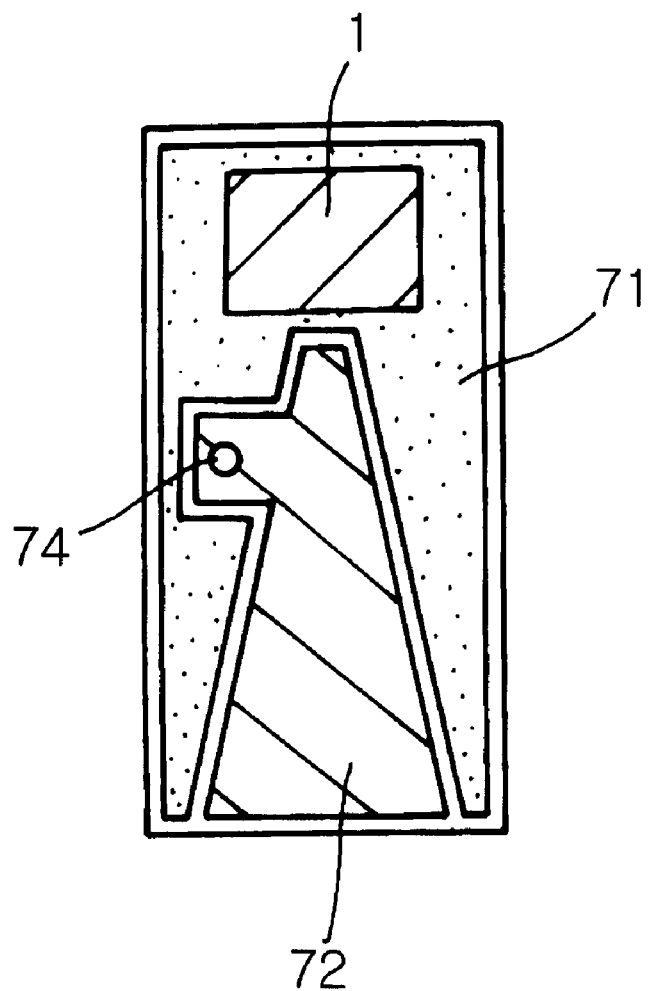

FIGS. 6A to 6C show several alternative embodiments of the metal layer and light receiving area in the laser diode package of the invention.

As shown in FIG. 6A, a light receiving area 12 of the invention is adapted to overlie the semiconductor substrate 13 constituting the photodiode 2 to correspond to the radiation area of light emitted from the laser diode 1. Therefore, a metal layer 11 is formed adjacent to the light receiving area 12 which is substantially triangular-configured with its width increasing as extending from a region adjacent to the laser diode 1 toward the lower end in the drawings. In this embodiment, the semiconductor substrate 13 comprises the light receiving area formed of a P+ layer in the lower end or lower edge portion thereof without being covered with the metal layer 11 in order to connect the lower end of the light receiving area 12 with a wire for electric connection therebetween. Therefore, the light receiving area 12 is wire bonded for electric connection in a portion 14 which is not exposed to the emission light from the laser diode 1.

FIG. 6B shows another alternative embodiment of the laser diode package of the invention. In this embodiment, a light receiving area 62 is defined by a horizontally exposed region in the lower end which is expanded to have a substantially rectangular configuration, a metal layer 61 is provided overlying the semiconductor substrate adjacent to the light receiving area 62. The metal layer 61 covers the semiconductor substrate up to certain positions from the laser diode 1 so as to form a P+ area functioning as the light receiving area 62 in the above configuration. The above configuration is designed to move the wire bonding portion 14 in FIG. 6A into a portion 64 in the side of a central region in order to cope with a situation where a space for wire bonding is hardly obtained owing to downsizing of the entire laser diode package. Accordingly this embodiment allows the heat-radiating design of the invention to be applied to a highly downsized laser diode package.

FIG. 6C shows a further another alternative embodiment of the laser diode package of the invention. The configuration of the metal layer 61 in FIG. 6B is further optimized to form a substantially triangular-shaped light receiving area 72 having a wire bonding portion 74 which is integrally projected from an upper side of the light receiving area 72 as shown in FIG. 6C. The above light receiving area 72 together with a metal layer 71 shown in FIG. 6C can provide a structure which is applicable to a miniature laser diode package while implementing the most preferred heat radiation structure.

Figure 8:
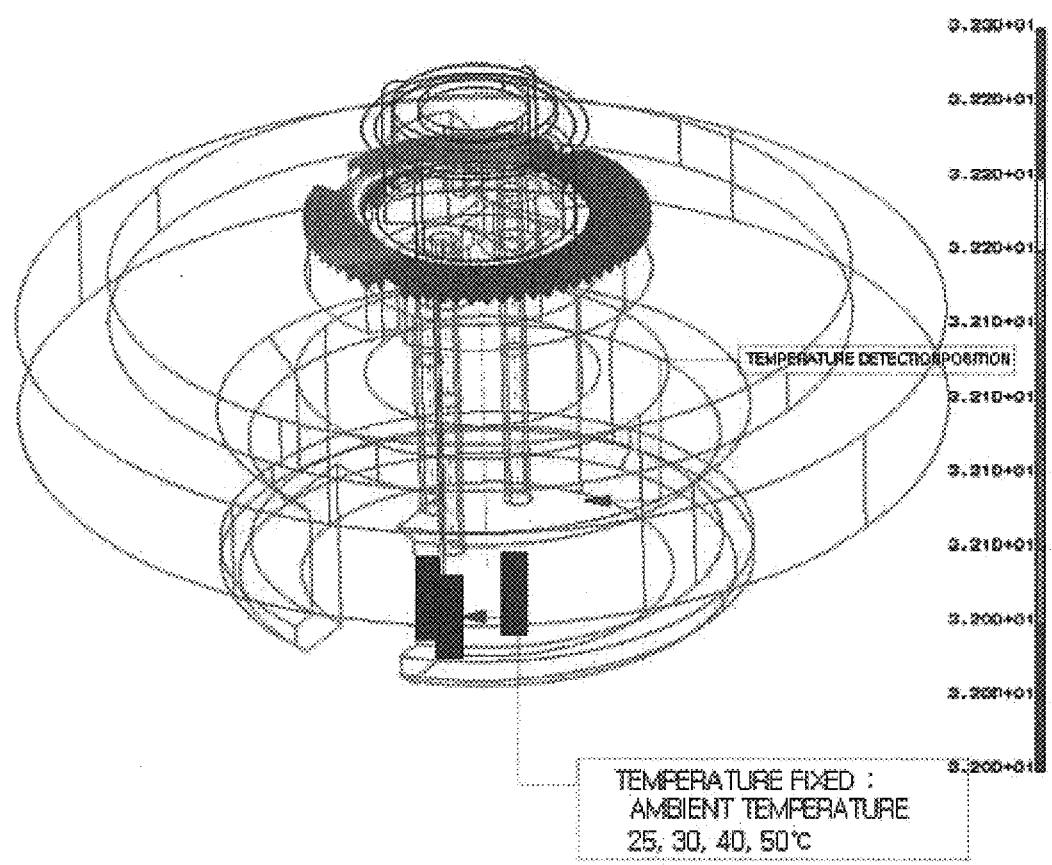
FIG. 8 shows temperature detection position for measuring heat radiation from a laser diode package of the invention.
Figure 9A:
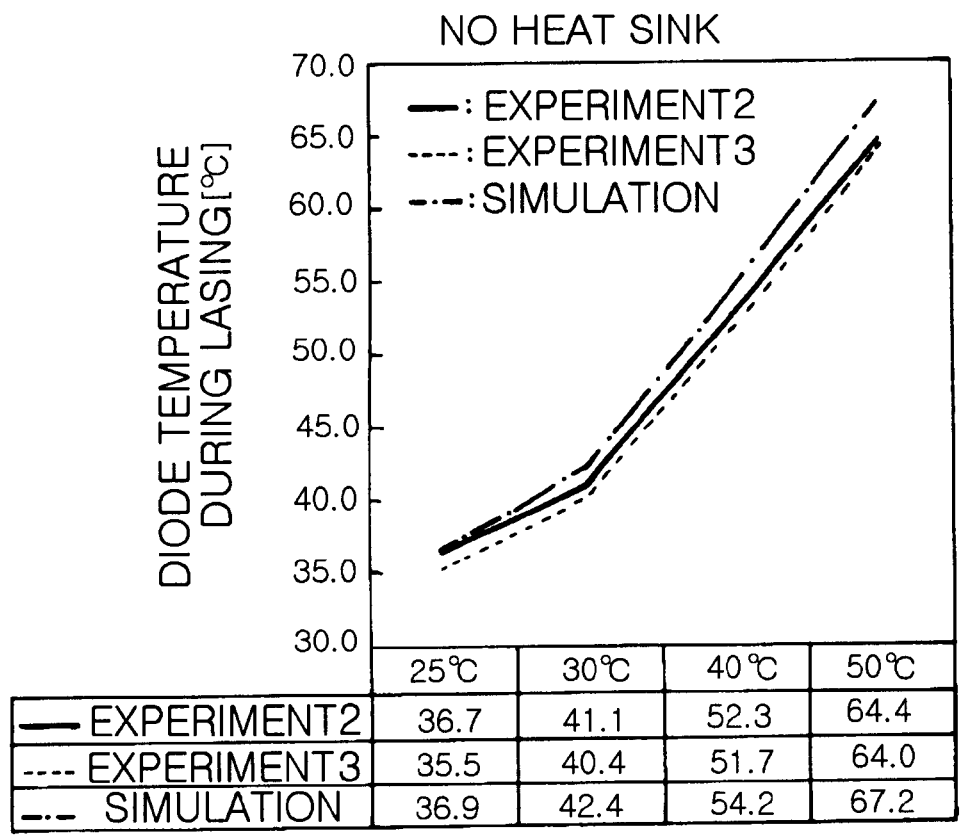
Figure 9B:
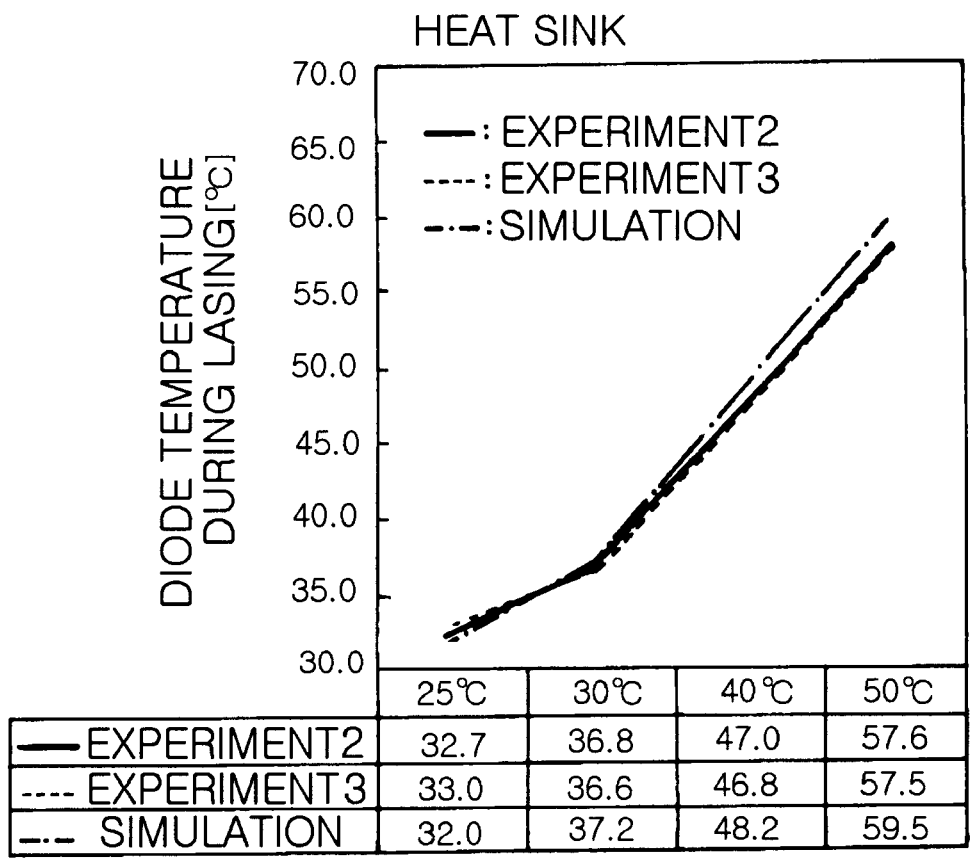

FIG. 8 shows a temperature detection position for measuring heat radiation from the laser diode package of the invention, and FIGS. 9A and 9B are graphs for showing correspondence between experiment values and simulation values of the laser diode package of the invention, in which FIG. 9A shows an example which has no heat sink, and FIG. 9B shows another example which has heat sink.

A temperature measuring method via simulation was adopted to measure the temperature of the laser diode package with the metal layer of the invention. In general, the temperature measuring method mainly adopts a contact-type detection policy using a thermocouple and a non-contact-type detection policy using infrared ray or a thermal camera. In the case of laser diode, however, it is difficult to directly measure the temperature of a laser diode chip during emission of laser light since the laser diode chip generally has a very small size of about 300×250 μm. This causes the laser diode to be designed for heat radiation by estimating temperature elevation via simulation rather than experiment. As such temperature estimated via simulation is lower, the laser diode has a more excellent heat-radiating design.

The temperature measuring method via simulation had assumptions and boundary conditions as follows:

There is no contact-type thermal resistance between the laser diode chip and the photodiode or between the photodiode and the submount;

All electric power except for lasing power is transformed into heat;

The tip of a lead frame contacting with the substrate has a temperature identical with the ambient temperature; and Natural convection is formed outside the submount.

Temperatures were measured with the thermocouple at the temperature detection position in FIG. 8 in order to verify precision of the simulation results via the above assumptions and boundary conditions. Since the temperatures could not be directly measured from the chip, the nearest position was selected to measure the temperatures in respect to four ambient temperatures, i.e. 25, 30, 40 and 50° C., and then the measured temperatures were compared.

FIGS. 9A and 9B are graphs illustrating simulation-verified results in comparison with the actual experiment values. Error ranges were about 1.4 to 4.7% apparently confirming that the simulated results precisely correspond to the actual experimented results. Therefore, it shall be understood that such simulation method and assumptions can properly estimate the temperatures of the laser diode package.

The above temperature measurement via simulation shows that the laser diode package of the invention has excellent temperature and thermal resistance features over the laser diode package having the conventional heat-radiating design. The results are reported in the following Table 1.

TABLE 1

Compared Values in Heat-Radiating Design

| | | Embodiments | | |
|---|---|---|---|---|
| | Com. Exam. | 1 | 2 | 3 |
| LD* Chip Size (μm) | 1210 × 810 | 970 × 760 | 1210 × 630 | 1210 × 630 |
| LD* Chip Temp. (° C.) | 57.8 | 57.2 | 57.1 | 57.0 |
| Thermal Resistance | 376.85 | 369.96 (1.8% Down) | 368.81 (2.1% Down) | 367.66 (2.4% Down) |

*LD: Laser Diode

As can be seen in Table 1, it shall be understood that the laser diode package with the improved metal layer of the invention-can be reduced with chip size and lowered with chip temperature in respect to the conventional design of laser diode package. It is also apparent that thermal resistance is lowered.

According to the above embodiments, the size can be reduced for about at least 22% based upon area and the performance can be enhanced for about at least 2.1% based upon thermal resistance over the conventional art design. Further, the embodiments are excellent since they can ensure the monitoring current Im identical with the conventional art design.

According to the invention as set forth above, the metal layer configuration of the invention is so designed in consideration of the radiation area of laser to expose the P+ area identical with the radiation area, as effects, so as to ensure the monitoring current identical with the conventional art design and reduce the diode package size as well as improve the heat-radiating features over the conventional art.

Although the invention has been shown and described with reference to the certain preferred embodiment thereof, it will be understood by those skilled in the art that various changes in form and details may be made therein without departing from the spirit and scope of the invention as defined in the appended claims.

What is claimed is:

1. A submount integrated photodiode to which a laser diode is mounted, the photodiode comprising:
    a semiconductor substrate having lower electrodes at the bottom;
    a light receiving area provided in an upper plane of said semiconductor substrate, and configured identical with an area in said upper plane of said semiconductor substrate made by light emitted from said laser diode to receive the light emitted from said laser diode;
    a metal layer provided adjacent to said light receiving area to cover said upper plane except for said light receiving area; and
    a bonding layer positioned overlying said metal layer on said semiconductor substrate for mounting said laser diode.

2. The submount integrated photodiode according to claim 1, wherein said light receiving area has a substantially triangular configuration widening as extending from a position adjacent to said laser diode toward the end of said semiconductor substrate.

3. The submount integrated photodiode according to claim 2, wherein the triangular configuration of said light receiving area has an end provided parallel to an edge of said semiconductor substrate to form wire bonding in a region which is not exposed to the light emitted from said laser diode.

4. The submount integrated photodiode according to claim 2, wherein said light receiving area has a portion projected from a side of the triangular configuration toward a side of said semiconductor substrate so that wire bonding is formed in said portion.

5. The submount integrated photodiode according to claim 2, wherein said light receiving area has the triangular configuration from a position adjacent to said laser diode up to a central region of said semiconductor substrate, and a substantially rectangular configuration from the central region up to the end said semiconductor substrate, the rectangular configuration having a side defined by the end of said semiconductor substrate.

6. A laser diode package having a submount integrated photodiode, comprising:
    a semiconductor substrate having lower electrodes at the bottom;
    a light receiving area provided in an upper plane of said semiconductor substrate for receiving light;
    a metal layer provided adjacent to said light receiving area to cover said upper plane except for said light receiving area;
    a bonding layer positioned overlying said metal layer on said semiconductor substrate for mounting said laser diode;
    a laser diode mounted in an upper face of said bonding layer, wherein said light receiving area configured identical with an area in said upper plane of said semiconductor substrate made by light emitted from said laser diode.

7. The submount integrated photodiode according to claim 6, wherein said light receiving area has a substantially triangular configuration widening as extending from a position adjacent to said laser diode toward the end of said semiconductor substrate.

8. The submount integrated photodiode according to claim 7, wherein the triangular configuration of said light receiving area has an end provided parallel to an edge of said semiconductor substrate to form wire bonding in a region which is not exposed to the light emitted from said laser diode.

9. The submount integrated photodiode according to claim 7, wherein said light receiving area has a portion projected from a side of the triangular configuration toward a side of said semiconductor substrate so that wire bonding is formed in said portion.

10. The submount integrated photodiode according to claim 7, wherein said light receiving area has the triangular configuration from a position adjacent to said laser diode up to a central region of said semiconductor substrate, and a substantially rectangular configuration from the central region up to the end said semiconductor substrate, the rectangular configuration having a side defined by the end of said semiconductor substrate.

* * * * *